United States Patent
Peng et al.

(10) Patent No.: US 7,382,618 B2
(45) Date of Patent: Jun. 3, 2008

(54) HEAT DISSIPATING APPARATUS FOR COMPUTER ADD-ON CARDS

(75) Inventors: Xue-Wen Peng, Shenzhen (CN); Rui-Hua Chen, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipie Hsien (TW)

( * ) Notice: Subject to any disclaimer, the term of this patent is extended or adjusted under 35 U.S.C. 154(b) by 61 days.

(21) Appl. No.: 11/309,856

(22) Filed: Oct. 13, 2006

(65) Prior Publication Data

US 2008/0089026 A1    Apr. 17, 2008

(51) Int. Cl.
*H05K 7/20* (2006.01)
*H01L 23/36* (2006.01)

(52) U.S. Cl. .............. 361/715; 361/690; 361/695; 361/696; 361/697; 361/704; 361/719; 165/80.3; 165/104.33; 165/185; 174/15.1; 174/16.3; 174/252; 257/717; 257/718

(58) Field of Classification Search ........ 361/690–697, 361/704, 687, 715–720; 165/80.2, 80.3, 165/80.4, 104.32, 104.33, 104.34, 121–126, 165/185; 257/706–727; 174/15.1, 15.2, 174/16.3, 252
See application file for complete search history.

(56) References Cited

U.S. PATENT DOCUMENTS

| | | | | |
|---|---|---|---|---|
| 6,101,091 | A * | 8/2000 | Baik | 361/704 |
| 6,249,436 | B1 * | 6/2001 | Bollesen | 361/720 |
| 6,452,797 | B1 * | 9/2002 | Konstad | 361/695 |
| 6,671,177 | B1 * | 12/2003 | Han | 361/719 |
| 6,717,811 | B2 * | 4/2004 | Lo et al. | 361/698 |
| 6,723,917 | B1 * | 4/2004 | Wang | 174/383 |
| 7,002,797 | B1 * | 2/2006 | Wittig | 361/695 |
| 7,142,427 | B2 * | 11/2006 | Reents | 361/704 |
| 7,190,591 | B2 * | 3/2007 | Peng et al. | 361/719 |
| 7,254,028 | B2 * | 8/2007 | Lee et al. | 361/704 |
| 7,283,364 | B2 * | 10/2007 | Refai-Ahmed et al. | 361/719 |

\* cited by examiner

*Primary Examiner*—Michael V Datskovskiy
(74) *Attorney, Agent, or Firm*—Jeffrey T. Knapp

(57) ABSTRACT

A heat dissipating apparatus for dissipating heat generated by a VGA card includes a heat sink and a retention assembly. The heat sink includes a base located on the add-on card, a plurality of fins, a fan for blowing air toward the fins and a cover for covering the fins and the fan. The retention assembly includes four pegs each having a first end locked in the base of the heat sink and a second end, a back plate secured beneath the add-on card and two wire clips. The second ends of the pegs extend through the base, the add-on card and the back plate in turn and are held in position by the wire clips beneath the back plate, whereby the heat sink and the back plate are secured to opposite sides of the add-on card.

15 Claims, 6 Drawing Sheets

HEAT DISSIPATING APPARATUS FOR COMPUTER ADD-ON CARDS

FIELD OF THE INVENTION

The present invention relates to a heat dissipating apparatus for computer add-on cards and particularly to a heat dissipating apparatus mounted onto a VGA (video graphic array) card for dissipating heat generated by a processor of the VGA card, wherein the heat dissipating apparatus is easily attached to the VGA card and does not need to require a special tool to operate it.

DESCRIPTION OF RELATED ART

Electronic components operate at high speed and generate substantial heat. The electronic components such as central processing units (CPUs), thermoelectric elements, video graphics array (VGA) cards, and power transistors generate a large amount of heat during operation. In many applications, it is desirable to employ a heat sink to remove the heat from these electronic components, to assure that the components function properly and reliably. A typical heat sink comprises a base for contacting the electronic component to absorb the heat originated from the electronic component and a plurality of fins extending from the base for dissipating the heat to ambient air.

To install the heat sink to the electronic component, a fixture is required. Since a space surrounding a computer add-on card such as a VGA card is quite narrow, the dimension of the fixture used to attach the heat sink to the VGA card has a height limitation. Screws are small in size, and serve as the fixture to extend through the base of the heat sink and the VGA card to engage with a back plate thereby to secure the heat sink on the VGA card. However, in the installation of the heat sink using the screws, a tool such as a screwdriver is required. The use of the screwdriver is very inconvenient and easy to interfere with other components mounted around the VGA card.

Accordingly, what is needed is a heat sink fastener which can easily and firmly attach a heat sink to a VGA card without using a tool. In addition, the fastener can be easily manipulated to detach the heat sink from the VGA card.

SUMMARY OF THE INVENTION

According to a preferred embodiment of the present invention, a heat dissipating apparatus adapted for dissipating heat generated by an add-on card, includes a heat sink and a retention assembly adapted to mount the heat sink on the add-on card. The heat sink includes a base adapted to be located on the add-on card, a plurality of fins soldered on the base, a fan positioned on the base to blow air toward the fins and a cover attached on the base and covering the fins and the fan. The retention assembly includes fours pegs having a first end locked above the base of the heat sink and a second end opposing the first end, a back plate secured beneath the add-on card and two wire clips. The second end of the pegs extend through the base, the add-on card, the back plate in turn and is held by the wire clip beneath the back plate.

Other advantages and novel features of the present invention will become more apparent from the following detailed description of preferred embodiment when taken in conjunction with the accompanying drawings, in which:

DETAILED DESCRIPTION OF THE INVENTION

Figure 1:
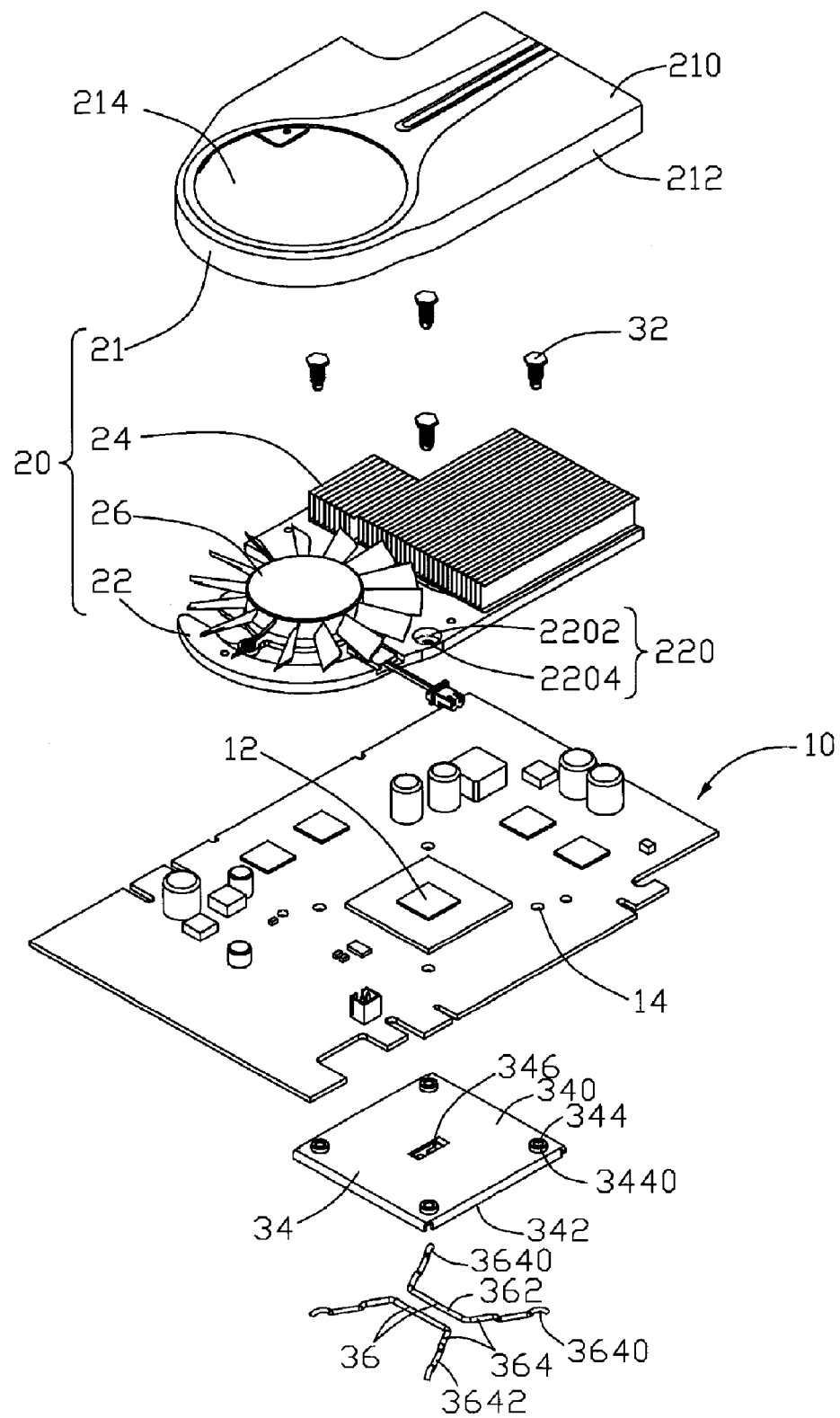
FIG. 1 is an exploded, isometric view of a heat dissipating apparatus according to a first preferred embodiment of the present invention, together with an add-on card having a processor thereon.
Figure 2:
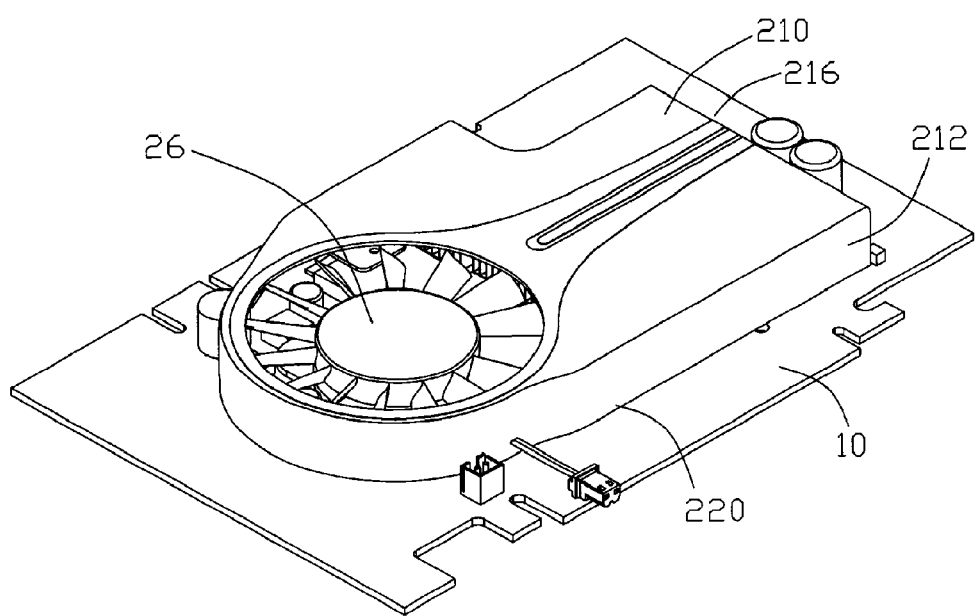
FIG. 2 is an assembled view of FIG. 1.

FIGS. 1-5 show a heat dissipating apparatus in accordance with a first preferred embodiment of the present invention. The heat dissipating apparatus mainly includes a heat sink 20 and a retention assembly 30. The heat sink 20 is mounted onto an add-on card 10 (such as a VGA card) by the retention assembly 30, for dissipating heat generated by a processor 12 mounted on the add-on card 10 to achieve effective heat dissipation. The card 10 symmetrically defines four mounting holes 14 around the processor 12.

The heat sink 20 comprises a base 22, a plurality parallel fins 24 soldered to the base 22, a fan 26 located on the base 22, and a cover 21 soldered onto the base 22 and covering the fins 24 and the fan 26. The base 22 symmetrically defines four locating holes 220 corresponding to the mounting holes 14 of the card 10 for extension of pegs 32 of the retention assembly 30 therethrough to mount the heat sink 20 onto the add-on card 20. Each locating hole 220 forms a descent step portion 2202 and a through hole 2204 therein. Each fin 24 is vertically arranged on the base 22, parallel to two opposite long sides of the base 22. All of the fins 24 are located at one end of the base 22 and occupy about a half of a top surface of the base 22 and form a plurality of parallel air passages (not labeled) therebetween. The fan 26 is located at an opposite end of the base 22 and occupies another half of the top surface of the base 22. The fan 26 is adjacent to intakes (not labeled) of the air passages.

The cover 21 has a shape similar to that of the base 22. The cover 21 comprises a top wall 210 parallel to and spaced from the base 22 and a lateral wall 212 extending downwardly from an edge of the top wall 210. An opening 214 is defined in the top wall 210 and aligned with the fan 26. The top wall 210 of the cover 21 is soldered to the fins 24 so that the fins 24 and the top wall of the cover 21 are thermally connected together. An exhaust port 216 (see FIG. 2) is defined between the top wall 210 and the base 22 and is remote from the fan 26. In the illustrated embodiment, the cover 21 is made of aluminum but alternatively it could be made of steel, copper or any other suitable material having good thermal conducting characteristics. Heat absorbed by the base 22 goes through the fins 24 to the cover 21 to achieve an enlarged heat dissipating area. Accordingly, the heat dissipating efficiency of the heat dissipating apparatus is enhanced; the heat is dissipated not only by the fins 24 but also by the cover 21. When the fan 26 rotates, an airflow is generated to flow from the opening 214 through the passages between fins 24 to leave the heat sink 20 via the exhaust port 216, whereby the heat generated by the processor 12 is forced to leave the add-on card 10, which according to the preferred embodiment, is a VGA card.

Figure 4:
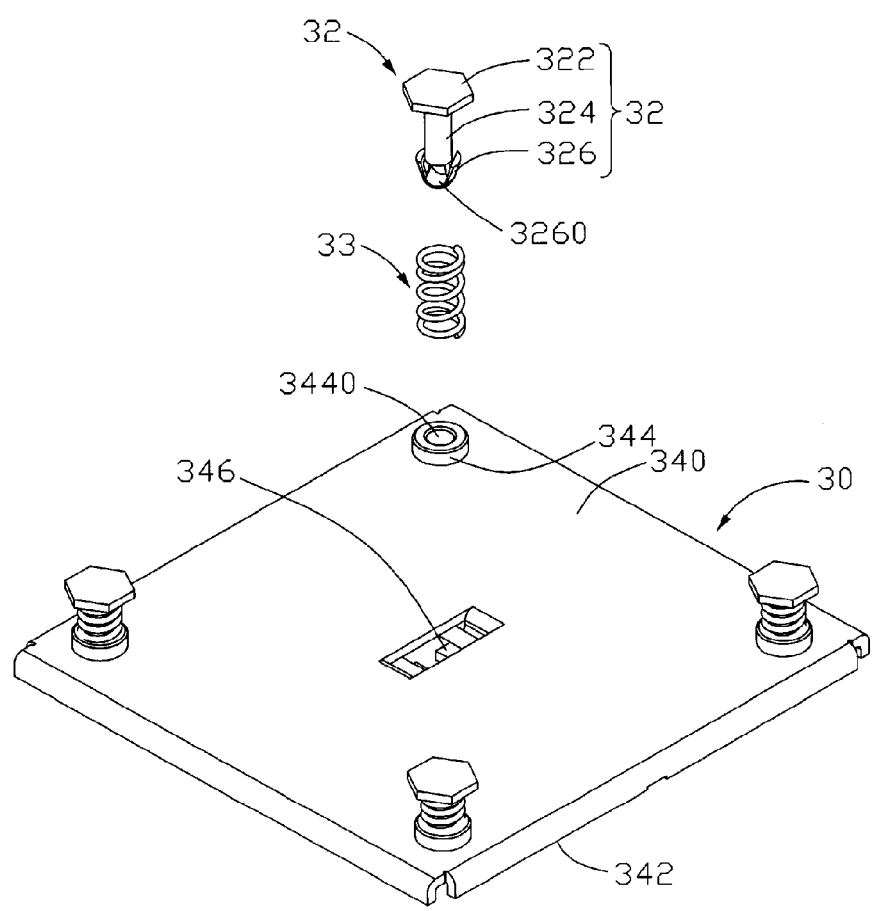
FIG. 4 is an exploded, isometric view of a retention assembly of the heat dissipating apparatus of FIG. 1.
Figure 5:
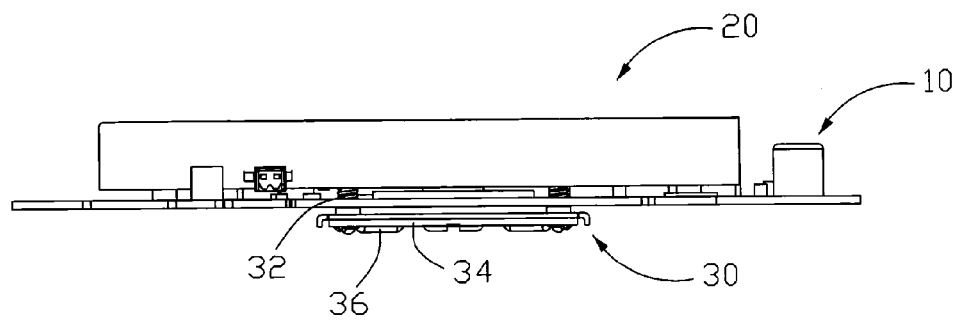
FIG. 5 is a right elevation of FIG. 2.

Also referring to FIG. 4, the retention assembly 30 includes four fixtures (not label), a back plate 34 and two wire clips 36. Each fixture includes a peg 32 and a spring 33. In the first embodiment of the present invention, the peg 32 is formed from a molded plastic material and has a head 322 at a first end thereof, an elongated shaft 324 extending axially from the head 322 and a prong 326 at a second end thereof opposing the first end. The head 322 has a width bigger than a diameter of the shaft 324 and is hexagonal in shape. The prong 326 defines an aperture 3260 in a centre thereof, for receiving a corresponding wire clip 36 beneath the back plate 34. The spring 33 closely encircles the shaft 324, and is held between the head 322 and the prong 326. Referring to FIG. 5, the head 322 perfectly is rested on the descent step portion 2202 of the heat sink 20 after the shaft 324 and the spring 33 closely encircling on the shaft 324 are extended through the through hole 2204 of the heat sink 20 and the corresponding wire clip 36 is positioned in the aperture 3260 of the prong 326 of the peg 32.

The back plate 34 is mounted below the card 10 and aligned with the processor 12. The back plate 34 is substantially rectangular and has a main body 340. The main body 340 has four flanges 342 respectively bent from four edges thereof, and adjacent to four corners thereof respectively provides four lugs 344 extending upwardly therefrom for supporting the springs 33 thereon after the pegs 32 extend through the lugs 344. Each lug 344 defines an orifice 3440 therein, corresponding to the mounting hole 14 of the card 10 and the locating hole 220 of the heat sink 20 for receiving the shaft 324 of a corresponding peg 32 encircled by the spring 33. An engaging part 346 is formed at a centre of a bottom surface of the main body 340. The engaging part 346 comprises two opposing bent tabs (not labeled) spaced from the main body 340. The wire clips 36 are interferentially engaged with the bent tabs and the main body 340 of the back plate 34 so that the wire clips 36 are positioned on the bottom surface of the back plate 34.

Figure 3:
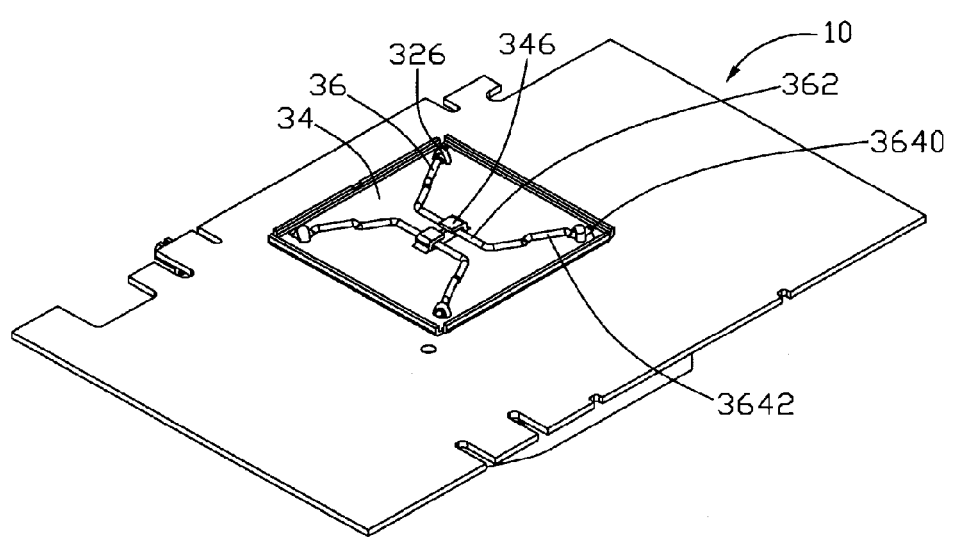
FIG. 3 is similar to FIG. 2, but viewed from another aspect.

Referring to FIG. 1 and FIG. 3, the wire clips 36 each are substantially U-shaped and made of a single piece of metallic wire. Each wire clip 36 comprises a linear connecting portion 362 engaged with the bent taps and the main body 340 of the back plate 34 and two latching arms 364 extending obliquely toward a same lateral side from two opposite ends of the connecting portion 362. A catch 3640 is formed at a distal end of each latching arm 364. The catch 3640 is receivable in the aperture 3260 and grasps a corresponding prong 326 of the peg 32 to lock the peg 32 in position. An offsetting section 3642 of each arm 364 is formed adjacent to the catch 3640. After the wire clips 36 are employed to the back plate 34, the offsetting sections 3642 are offset from and parallel to the main body 340 of the back plate 34 and the remains of the latching arms 364 are abutted against the main body 340 of the back plate 34. The offsetting section 3642 serves as an operating section for facilitating an operation of the wire clips 36 to have the catches 3640 of the wire clips 36 received in the apertures 3260 of the pegs 32.

Particularly referring to FIG. 3 and FIG. 5, in the use of the heat dissipating assembly, the heat sink 20 is placed on the card 10 with the base 22 contacting with the top surface of the processor 12. The pegs 32 encircled by the springs 33 are extended into, in series, the through holes 2204 of the base 22, mounting holes 14 of the card 10, and orifices 3440 of the back plate 34. The pegs 32 are so extended, until the heads 322 are rested on the step portions 2202 of the locating holes 220 of the base 22 and the prongs 326 are projected from bottom surface of the main body 340 of the back plate 34. The catches 3640 of the wire clips 36 are subsequently operated to insert into the apertures 3260 of the prongs 326 of the pegs 32 to position the pegs 32 in place. At this time, the springs 33 are rested on the lugs 344 of the back plate 34 and compressed between the head 322 and the lugs 344. The heads 322 depress heat sink 20 towards the processor 12 and the wire clips 36 which grasp the prongs 326 of the pegs 32, press the back plate 34 towards the card 10. The heat sink 20 is thus firmly mounted to the card 10 and intimately contacts the heat-generating processor 12, without using any additional tool.

Figure 6:
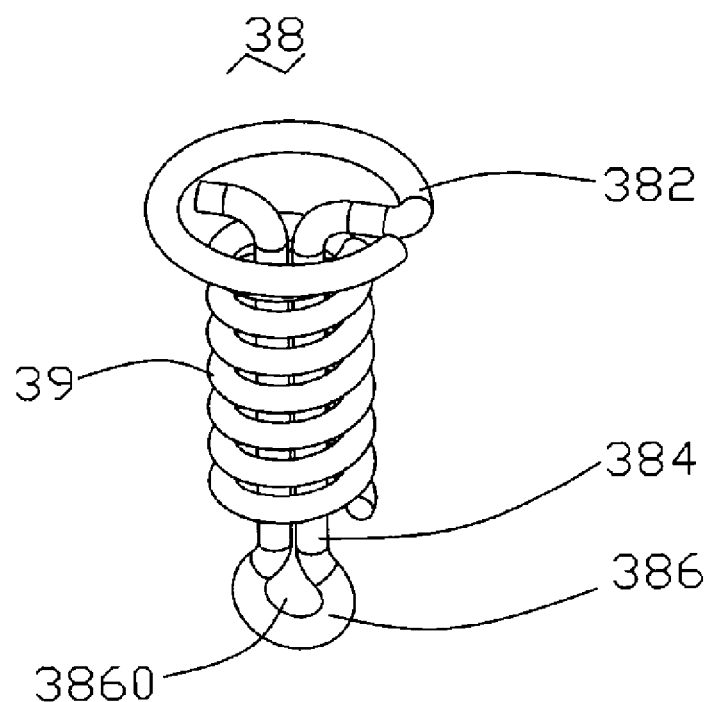
FIG. 6 is an enlarged view of a fixture according to a second preferred embodiment of the present invention.

FIG. 6 shows a heat dissipating apparatus in accordance with a second preferred embodiment of the present invention. The heat dissipating apparatus of the second preferred embodiment is similar to that of the first preferred embodiment. However, four wire pegs 38 replace the pegs 32 of retention assembly 30 in the first embodiment. The wire pegs 38 each is of the same function and usage with the peg 32, and is formed by bending a single piece of metallic wire to get the advantage of low cost. The wire peg 38 comprises a head 382, an extending part 384 and a ring 386. The ring 386 defines a hole 3860 therein. The head 382 is circular in shape and located at a top end of the peg 38. The extending part 384 first extends downward from an end of the head 382, forms the ring 386 at a bottom end of the peg 38, and then extends upwardly to reach the head 382. The extending part 384 connecting the head 382 and the ring 386 together is encircled by a spring 39 closely. In the use of the retention assembly, the wire pegs 38 work in a way similar to that of the pegs 32 in accordance with the first preferred embodiment of the present invention.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat dissipating apparatus adapted for dissipating heat generated by an add-on card, comprising:
   a heat sink comprising a base adapted to be located on the add-on card and thermally contact with a processor of the add-on card, a plurality of fins on the base, a fan positioned on the base to blow air toward the fins and a cover attached on the base and covering the fins and the fan;
   four pegs each comprising a first end locked in the base of the heat sink and a second end opposing the first end;
   a back plate disposed beneath the add-on card; and
   two wire clips coupled to a bottom of the back plate, wherein the second ends of the pegs extend through the base of the heat sink, the add-on card and the back plate subsequently to engage with the wire clips thereby fastening the heat sink and the back plate to add-on card.

2. The heat dissipating apparatus as described in claim 1, wherein each of the wire clips has a connecting portion attached to the bottom of the back plate and two latching arms obliquely extending from two opposing ends of the connecting portion, the two latching arms extending to engage with the second ends of two corresponding pegs.

3. The heat dissipating apparatus as described in claim 2, wherein each of the wire clips is substantially U-shaped.

4. The heat dissipating apparatus as described in claim 3, wherein each of the latching arms defines a catch at a distal end thereof, each of the two corresponding pegs defines an aperture in the second end thereof for receiving the catch.

5. The heat dissipating apparatus as described in claim 4, wherein each of the latching arms forms an offsetting operating section located adjacent to the catch.

6. The heat dissipating apparatus as described in claim 2, wherein each of the pegs is formed from molded plastic material and has a head at the first end which is locked in the base and a prong at the second end which is locked beneath the back plate.

7. The heat dissipating apparatus as described in claim 2, wherein the peg is formed by bending a single piece of metallic wire and has a circle-shaped head at the first end thereof and a ring at the second end thereof, the ring being for receiving a corresponding latching arm.

8. The heat dissipating apparatus as described in claim 1, wherein the peg is encircled by a spring, and the spring is compressed between the first end of the peg and the back plate.

9. The heat dissipating apparatus as described in claim 2, wherein the back plate is provided with an engaging part at a centre of the bottom thereof for engaging with the connecting portions of the wire clips.

10. A heat dissipating apparatus comprising:
a heat sink comprising a base located on an add-on card, adapted for thermally connecting with a processor of the add-on card, a plurality of fins on the base, a fan positioned on the base to blow air toward the fins and a cover attached on the base and covering the fins and the fan; and
a retention assembly comprising fours pegs each having a first end locked in the base of the heat sink and a second end opposing the first end, a back plate secured beneath the add-on card and two wire clips, wherein the second ends of the pegs extend through the base, the add-on card, the back plate in turn and are held in position by the wire clips beneath the back plate.

11. The heat dissipating apparatus as described in claim 10, wherein each of the wire clips has a connecting portion attached to the bottom of the back plate and two latching arms obliquely extending from two opposing ends of the connecting portion to hold the second ends of two corresponding pegs in position.

12. The heat dissipating apparatus as described in claim 11, wherein each of the latching arm defines a catch at a distal end thereof, each of the pegs defines an aperture in the second end thereof for receiving the catch.

13. The heat dissipating apparatus as described in claim 11, wherein each of the pegs is formed from molded plastic material and has a head at the first end which is locked in the base and a prong at the second end which is locked beneath the back plate.

14. The heat dissipating apparatus as described in claim 11, wherein each of the pegs is formed by bending a single piece of metallic wire and has a circle-shaped head at the first end thereof and a ring at the second end thereof, the ring being for receiving a corresponding latching arm of one of the wire clips.

15. The heat dissipating apparatus as described in claim 11, wherein each of the pegs is encircled by a spring, and the spring is compressed between the first end and the back plate.

* * * * *